(12) United States Patent
Cadouri

(10) Patent No.: US 7,617,465 B1
(45) Date of Patent: Nov. 10, 2009

(54) METHOD AND MECHANISM FOR PERFORMING LATCH-UP CHECK ON AN IC DESIGN

(75) Inventor: Eitan Cadouri, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 326 days.

(21) Appl. No.: 11/229,324

(22) Filed: Sep. 15, 2005

Related U.S. Application Data

(60) Provisional application No. 60/611,066, filed on Sep. 16, 2004.

(51) Int. Cl.
*G06F 17/50* (2006.01)
(52) U.S. Cl. .................. 716/5; 716/4; 716/6; 716/8; 716/9; 716/10; 716/11
(58) Field of Classification Search ............... 716/4–6, 716/8–11
See application file for complete search history.

(56) References Cited

U.S. PATENT DOCUMENTS

| | | | | |
|---|---|---|---|---|
| 4,937,756 A * | 6/1990 | Hsu et al. ................. 716/5 |
| 5,446,649 A * | 8/1995 | Keum ..................... 700/57 |
| 5,469,366 A | 11/1995 | Yang et al. |
| 5,557,534 A * | 9/1996 | Wu ....................... 716/19 |
| 5,586,059 A * | 12/1996 | Oshelski et al. ........... 702/84 |
| 5,887,155 A * | 3/1999 | Laidig ................... 716/10 |
| 5,930,499 A | 7/1999 | Chen et al. |
| 5,943,486 A * | 8/1999 | Fukui et al. .............. 716/9 |
| 5,987,086 A * | 11/1999 | Raman et al. ............. 716/1 |
| 6,009,251 A * | 12/1999 | Ho et al. ................. 716/5 |
| 6,209,123 B1 * | 3/2001 | Maziasz et al. ............ 716/14 |
| 6,291,322 B1 * | 9/2001 | Clement ................. 438/510 |
| 6,380,593 B1 * | 4/2002 | Maxey et al. ............. 257/371 |
| 6,480,816 B1 | 11/2002 | Dhar |
| 6,532,578 B2 * | 3/2003 | Chakraborty et al. ......... 716/7 |
| 6,550,047 B1 * | 4/2003 | Becker ................... 716/8 |
| 6,553,542 B2 * | 4/2003 | Ramaswamy et al. ........ 716/2 |
| 6,560,753 B2 * | 5/2003 | Barney et al. ............. 716/2 |
| 6,711,725 B1 * | 3/2004 | Rutenbar et al. ........... 716/8 |
| 6,828,689 B2 * | 12/2004 | Madurawe ............... 257/213 |
| 7,065,729 B1 * | 6/2006 | Chapman ................ 716/13 |
| 7,089,520 B2 * | 8/2006 | Voldman ................. 716/9 |
| 7,089,521 B2 * | 8/2006 | Kurzum et al. ............ 716/10 |
| 7,134,102 B2 | 11/2006 | McGaughy et al. |
| 7,143,021 B1 | 11/2006 | McGaughy et al. |
| 7,200,825 B2 * | 4/2007 | Watson et al. ............. 716/6 |
| 7,243,317 B2 * | 7/2007 | Wang et al. .............. 716/4 |
| 7,250,660 B1 * | 7/2007 | Huang et al. ............. 257/355 |
| 7,257,525 B2 | 8/2007 | McGaughy |
| 7,328,143 B2 | 2/2008 | McGaughy |
| 7,346,480 B1 | 3/2008 | Pekarek et al. |
| 2002/0026449 A1 | 2/2002 | Azencott |
| 2005/0060672 A1 | 3/2005 | Poechmueller |
| 2005/0143966 A1 | 6/2005 | McGaughy |
| 2005/0149311 A1 | 7/2005 | McGaughy |
| 2005/0149312 A1 | 7/2005 | McGaughy |
| 2005/0149889 A1 * | 7/2005 | Messerman et al. ......... 716/3 |
| 2005/0273748 A1 * | 12/2005 | Hetzel et al. ............. 716/14 |
| 2007/0094623 A1 | 4/2007 | Chen et al. |
| 2007/0099314 A1 | 5/2007 | Chen et al. |

\* cited by examiner

*Primary Examiner*—Naum B Levin
(74) *Attorney, Agent, or Firm*—Vista IP Law Group, LLP

(57) ABSTRACT

Disclosed is a system and method for performing latchup checks for an IC design. In one approach, partitioning is used to create separate sections of the geometry to analyze. The data is then checked by performing graph manipulations.

30 Claims, 4 Drawing Sheets

METHOD AND MECHANISM FOR PERFORMING LATCH-UP CHECK ON AN IC DESIGN

CROSS-REFERENCE TO RELATED APPLICATIONS

The present application claims the benefit of U.S. Provisional Application No. 60/611,066, filed on Sep. 16, 2004, which is hereby incorporated by reference in its entirety.

BACKGROUND

The invention relates to technology for implementing electronic design automation tools, and in particular, tools for performing latch-up check operations for design rule checks (DRCs) in an integrated circuit ("IC") design.

An IC is a small electronic device typically formed from semiconductor material. Each IC contains a large number of electronic components, e.g., transistors, that are wired together to create a self-contained circuit device. The components and wiring on the IC are materialized as a set of geometric shapes that are placed and routed on the chip material. During placement, the location and positioning of each geometric shape corresponding to an IC component are identified on the IC layers. During routing, a set of routes are identified to tie together the geometric shapes for the electronic components.

Once the layout is finished, it is verified to make sure it satisfies the design rules, which are typically provided by the foundry that is to manufacture the IC device. This verification process is called Design Rule Check (DRC). The design rules are a set of rules regarding minimum distances, sizes, enclosure criteria, among other constraints for implementing the layout. The rules have to be observed in order to maximize chances of a successful fabrication of the integrated circuit.

Types of errors that are intended to be avoided by performing DRC include unwanted parasitic effects such as latch-up. To illustrate, consider the layout geometry shown in FIG. 1, which can be called an "nwell". The nwell may include or be associated with arbitrary shapes. Inside the nwell are two geometries, one of which is called the n-tap or S and the other is the p-tap or D. The n-tap is marked as a circle and the p-tap is marked as a square.

To perform a latchup check, one of the rules that is measured is the distance between the n-tap to the p-tap inside the nwell. This check does not necessarily measure the most direct distance between them, but will measure the distance within the nwell between the two shapes.

One current approach to perform this type of latchup check is implemented as a sequence of sizing and AND operations. Essentially, an area is defined over a portion of the nwell and an AND operations is performed. The process then takes another area and performed another AND operation. This is a sequence that repeats itself as a series of such size/AND operations. The last step of the process is to identify areas in the nwell that are not appropriately covered by the analyzed areas, which are marked with an error if not within a suitable distance.

A drawback of this approach is that if there are two nwells that are adjacent to each other, then a large size may be drawn that overlaps portions of both nwells. Because of this, the size is limited by a minimum spacing between two nwells, so the process cannot use excessively large steps for the analysis, which could reduce efficiently of the process. Another problem that could result from not being able to use large steps is that there may exist some inaccuracy as a result.

Therefore, there is a need for an improved approach to implement latchup checks which are more efficient and accurate. Some embodiments of the present invention provides an efficient approach for performing latchup checks for an IC design. In one embodiment, partitioning is used to create separate sections of the geometry to analyze. The data is then checked by performing graph manipulations.

DETAILED DESCRIPTION

Embodiments of the present invention provides an efficient approach for performing latchup checks for an IC design. In one embodiment, partitioning is used to create separate sections of the geometry to analyze. The data is then checked by performing graph manipulations.

Figure 2:
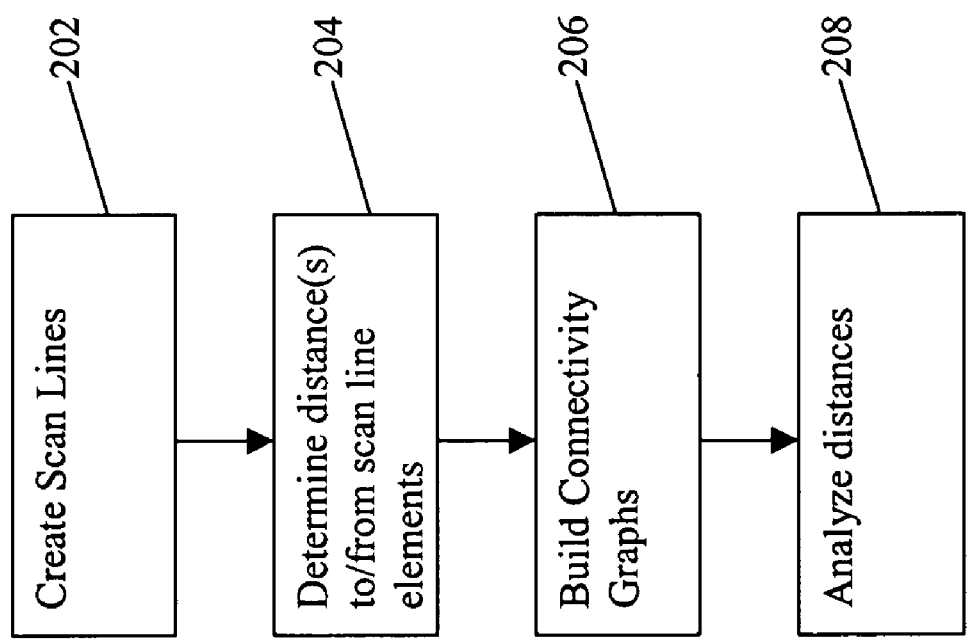
FIG. 2 shows a process flow of an approach for implementing efficient latchup check according to an embodiment of the invention.

FIG. 2 shows a process flow of an approach for implementing efficient latchup check according to an embodiment of the invention. The approach can be used to measure two layers within a third layer. Examples of specific applications in which the process and system may be applied include to measure required distances for nwells and pwells.

The first action is to partition the geometry (202). One approach to partition the geometry is to create one or more scan lines within the geometry.

Distances are then determined between various points in the geometry and the partition points (204). If scan lines are used, then the distances are determined between the various points in the geometry and the scan line. One approach to implement this action is to create a set of grid points along each scan line. Distances are then measured from the source and/or the destination to each of the grid points.

Connectivity graphs are built between the various points in the design (206). The connectivity graphs can be used to determine distances between the different geometric locations. The distances are thereafter analyzed (208). An example of a type of analysis that may be performed is to determine, based upon the identified distances, whether any distance or spacing-based design rules have been violated. The analysis can also be used to determine the existence of parasitic effects such as latch-up.

Figure 1:
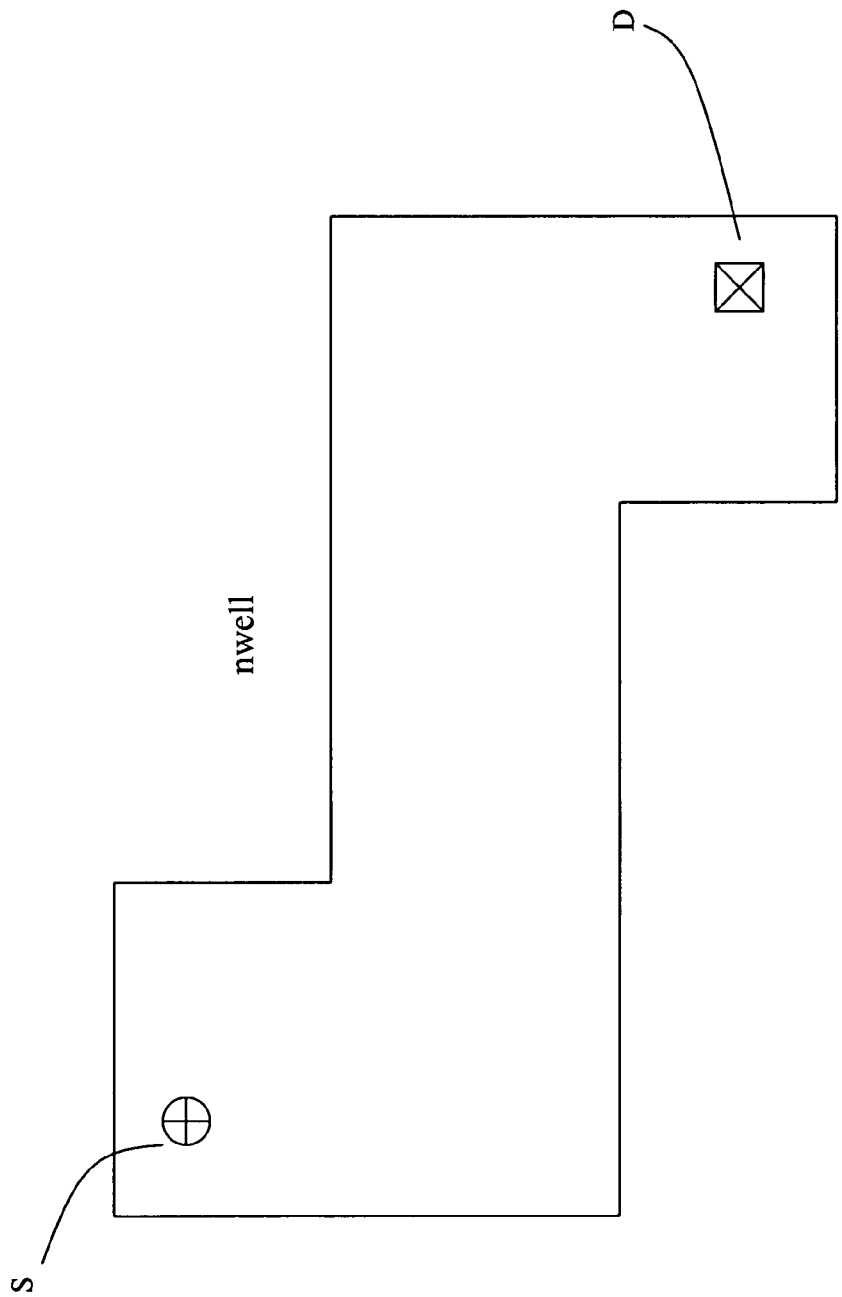
FIG. 1 illustrates an example nwell.
Figure 3:
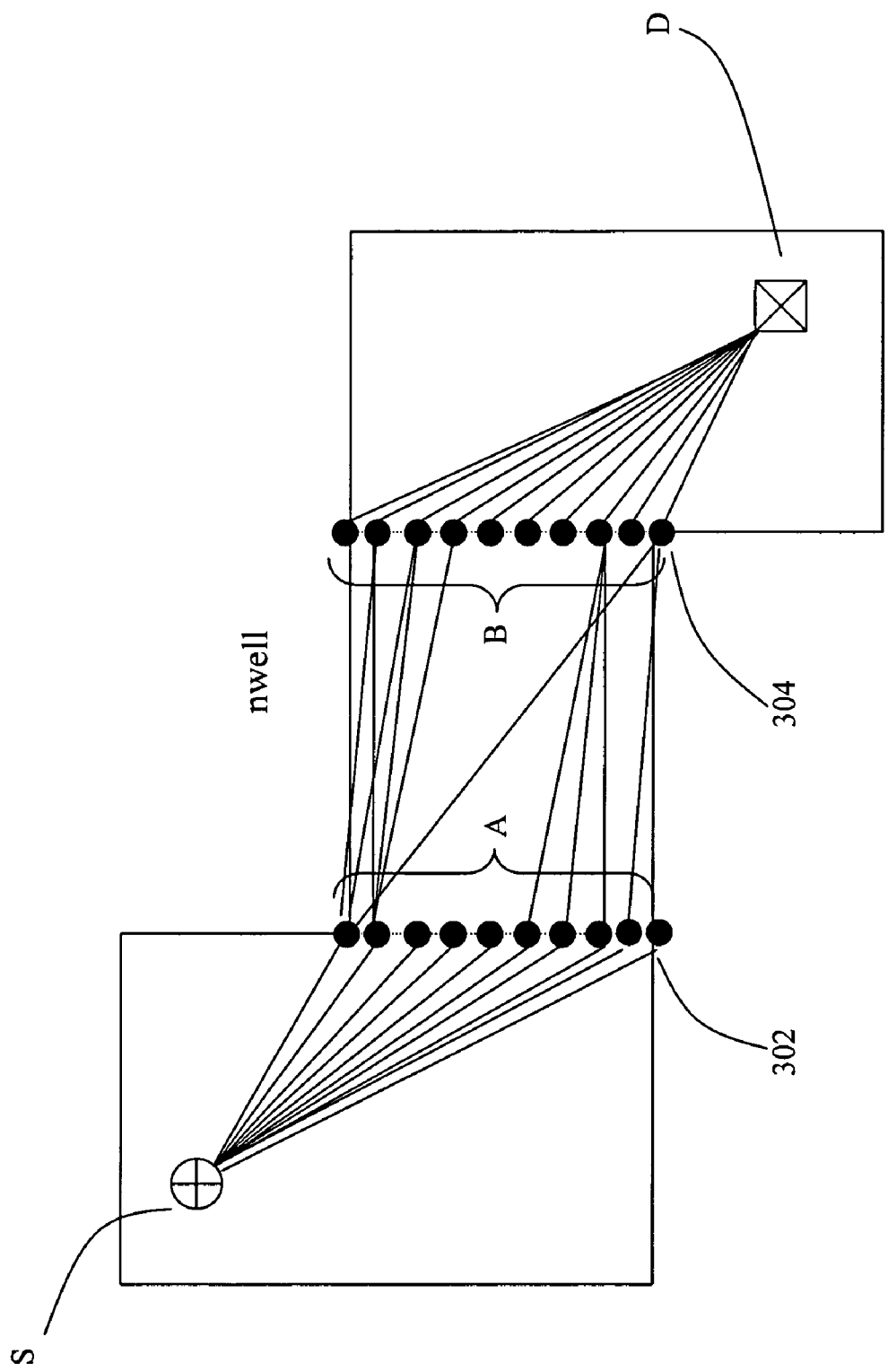
FIG. 3 provides an illustrated example of implementing the process of FIG. 2 against the nwell of FIG. 1.

FIG. 3 illustrates an application of this process on the nwell structure of FIG. 1 in accordance with some embodiments. To begin, two vertical scan lines 302 and 304 are created within the nwell to partition the nwell geometry.

Grid points are identified along each vertical scan line 302 and 304. These are collectively marked as grid points A and grid points B. Therefore, there is a first group of grid points A along scan line 302 and the second group of grid points B along scan line 304.

Distances are identified within the geometry. For example, distances from source S to any grid point A along scan line 302 are identified. In addition, distances from D to any grid point B along scan line 304 are identified. In one embodiment, this action of determining distances can be performed while building the scan lines. In addition, distances can be measured between grid points along A and grid points along B.

Connectivity graphs are now constructed for the nwell. For example, between source S and the grid points A on scan line 302, connectivity graph(s) can be built:

(s)-------------------{A

Between grid points A on scan line 302 and the grid points B on the next scan line 304, another one or more connectivity graphs can be built:

{A--------------------B}

Between grid points B on scan line 304 and the destination D, connectivity graph(s) can also be built:

}B--------------------D

Once the process finishes building the graphs, distances can be identified and analyzed by merely traversing the connectivity graphs. This is performed by identifying the paths between source S and destination D. The distances for these paths are measured and analyzed to determine if the required distances parameters of the design rules have been violated. This analysis will also predict whether parasitic effects such as latch-up exist in the design portion being analyzed.

As noted earlier, the present approach can be applied to any application in which it is desired to measure distances for DRC processing, such as when it is desired to measure two layers within a third layer. Particular examples in which the invention may be applied includes analysis of nwells and pwells, but the scope of the invention extends beyond just these two types of structures.

System Architecture Overview

Figure 4:
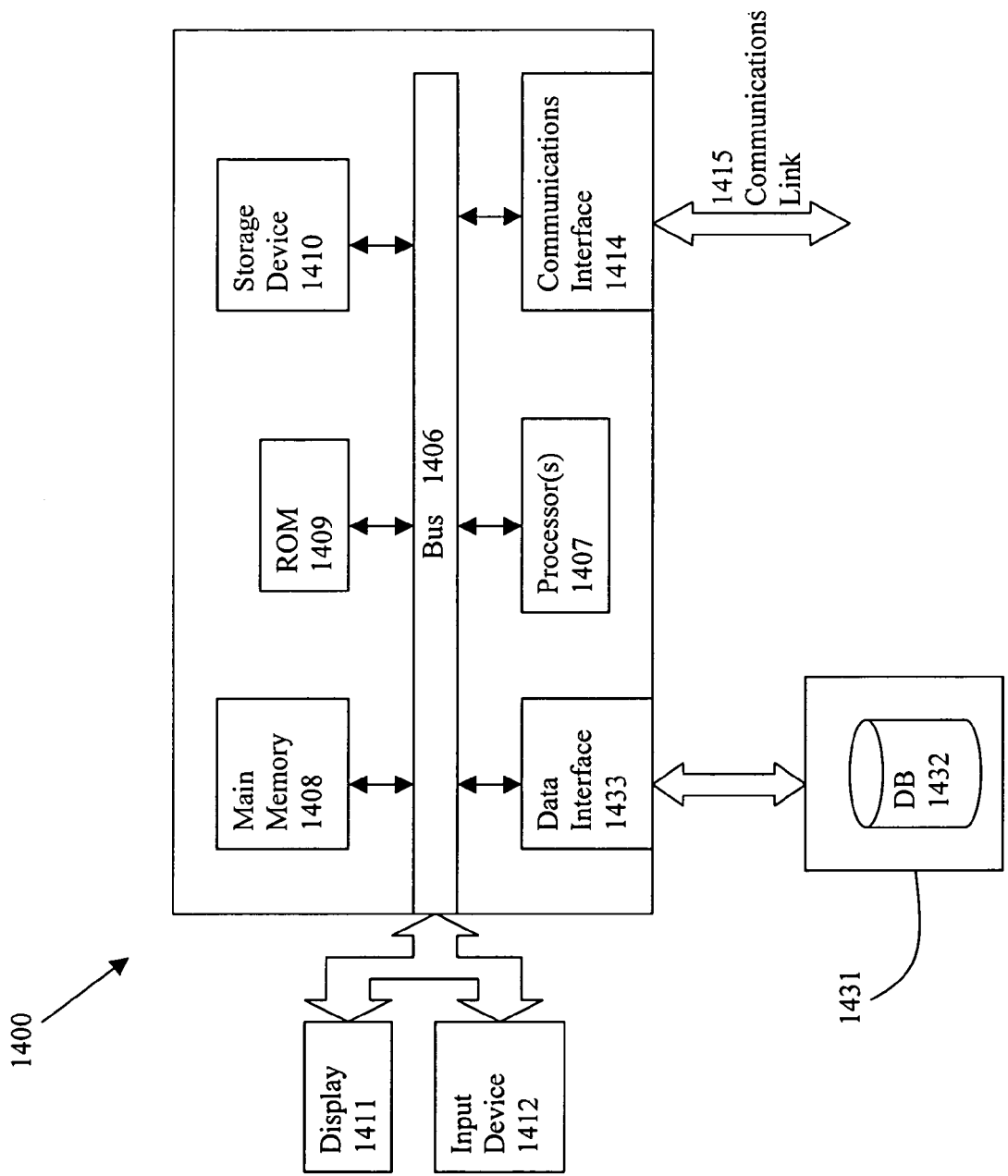
FIG. 4 illustrates an example computing architecture with which embodiments of the invention may be practiced.

FIG. 4 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408. Transmission media includes coaxial cables, copper wire, and fiber optics, including wires that comprise bus 1406. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method of performing a Design Rule Check of an IC design, comprising:
   partitioning a geometry associated with the IC design;
   determining distances within various points in the geometry;
   creating connectivity graphs by a processor between a source and a destination for the various points in an nwell or pwell structure of the geometry, wherein distances associated with the various points in the nwell or pwell structure are measured by traversing a plurality of different paths between the source and the destination of the connectivity graphs;
   storing the connectivity graphs on a volatile or non-volatile computer usable medium device or displaying the connectivity graphs in a display device; and
   analyzing the connectivity graphs to determine if a design rule has been violated.

2. The method of claim 1 in which one or more scan lines are created to partition the geometry.

3. The method of claim 2 in which a set of grid points is created along each scan line.

4. The method of claim 3 in which the measured distances comprise distances to/from the grid points.

5. The method of claim 3 in which the connectivity graphs are built to/from the grid points.

6. The method of claim 1 in which paths are identified, wherein distances are analyzed for each of the paths.

7. The method of claim 1 further comprising:
   determining whether a parasitic effect exists in the IC design.

8. The method of claim 7 in which the parasitic effect comprises latch-up.

9. The method of claim 1 in which the geometry comprises two shapes within a third shape.

10. The method of claim 1 in which the geometry comprises the nwell or pwell structure.

11. A system for performing a Design Rule Check of an IC design, comprising:
- means for partitioning a geometry associated with the IC design;
- means for determining distances within various points in the geometry;
- a processor for creating connectivity graphs between a source and a destination for the various points in an nwell or pwell structure of the geometry, wherein distances associated with the various points in the nwell or pwell structure are measured by traversing a plurality of different paths between the source and the destination of the connectivity graphs;
- a volatile or non-volatile computer usable medium device for storing the connectivity graphs or a display device for displaying the connectivity graphs; and
- means for analyzing the connectivity graphs to determine if a design rule has been violated.

12. The system of claim 11 in which one or more scan lines are created to partition the geometry.

13. The system of claim 12 in which a set of grid points is created along each scan line.

14. The system of claim 13 in which the measured distances comprise distances to/from the grid points.

15. The system of claim 13 in which the connectivity graphs are built to/from the grid points.

16. The system of claim 11 in which paths are identified, wherein distances are analyzed for each of the paths.

17. The system of claim 11 further comprising:
- means for determining whether a parasitic effect exists in the IC design.

18. The system of claim 17 in which the parasitic effect comprises latch-up.

19. The system of claim 11 in which the geometry comprises two shapes within a third shape.

20. The system of claim 11 in which the geometry comprises the nwell or pwell structure.

21. A computer program product comprising a volatile or non-volatile computer usable storage medium device having executable code to execute by a processor a process for performing a Design Rule Check of an IC design, the process comprising:
- partitioning a geometry associated with the IC design;
- determining distances within various points in the geometry;
- creating connectivity graphs between a source and a destination for the various points in an nwell or a pwell structure of the geometry, wherein distances associated with the various points in the nwell or pwell structure are measured by traversing a plurality of different paths between the source and the destination of the connectivity graphs;
- storing the connectivity graphs or displaying the connectivity graphs on a display device; and
- analyzing the connectivity graphs to determine if a design rule has been violated.

22. The computer program product of claim 21 in which one or more scan lines are created to partition the geometry.

23. The computer program product of claim 22 in which a set of grid points is created along each scan line.

24. The computer program product of claim 23 in which the measured distances comprise distances to/from the grid points.

25. The computer program product of claim 23 in which the connectivity graphs are built to/from the grid points.

26. The computer program product of claim 21 in which paths are identified, wherein distances are analyzed for each of the paths.

27. The computer program product of claim 21 further comprising:
- determining whether a parasitic effect exists in the IC design.

28. The computer program product of claim 27 in which the parasitic effect comprises latch-up.

29. The computer program product of claim 21 in which the geometry comprises two shapes within a third shape.

30. The computer program product of claim 21 in which the geometry comprises the nwell or pwell structure.

* * * * *

UNITED STATES PATENT AND TRADEMARK OFFICE
CERTIFICATE OF CORRECTION

PATENT NO.       : 7,617,465 B1                              Page 1 of 1
APPLICATION NO. : 11/229324
DATED            : November 10, 2009
INVENTOR(S)      : Eitan Cadouri It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 737 days.

Signed and Sealed this

Nineteenth Day of October, 2010

David J. Kappos
*Director of the United States Patent and Trademark Office*